US012777726B2

(12) United States Patent
Zhou et al.

(10) Patent No.: US 12,777,726 B2
(45) Date of Patent: Oct. 27, 2026

(54) VERTICAL GALLIUM OXIDE TRANSISTOR AND PREPARATION METHOD THEREOF

(71) Applicant: UNIVERSITY OF SCIENCE AND TECHNOLOGY OF CHINA, Hefei (CN)

(72) Inventors: Xuanze Zhou, Hefei (CN); Guangwei Xu, Hefei (CN); Shibing Long, Hefei (CN)

(73) Assignee: UNIVERSITY OF SCIENCE AND TECHNOLOGY OF CHINA, Hefei (CN)

( * ) Notice: Subject to any disclaimer, the term of this patent is extended or adjusted under 35 U.S.C. 154(b) by 473 days.

(21) Appl. No.: 18/216,425

(22) Filed: Jun. 29, 2023

(65) Prior Publication Data

US 2024/0079477 A1 Mar. 7, 2024

Related U.S. Application Data

(63) Continuation of application No. PCT/CN2022/119566, filed on Sep. 19, 2022.

(30) Foreign Application Priority Data

Sep. 7, 2022 (CN) ......................... 202211089166.6

(51) Int. Cl.
*H10D 99/00* (2025.01)
*H10D 30/67* (2025.01)
(Continued)

(52) U.S. Cl.
CPC ......... *H10D 99/00* (2025.01); *H10D 30/6728* (2025.01); *H10D 30/6755* (2025.01);
(Continued)

(58) Field of Classification Search
CPC ......... H10D 99/00; H10D 8/60; H01L 21/477
See application file for complete search history.

(56) References Cited

U.S. PATENT DOCUMENTS 10,230,007 B2 * 3/2019 Sasaki .................. H01L 21/425
2014/0217405 A1 * 8/2014 Sasaki ................ H10D 30/0291 257/43

(Continued)

FOREIGN PATENT DOCUMENTS

CN 110148625 A 8/2019
CN 113257924 A 8/2021

(Continued)

OTHER PUBLICATIONS

Fulay, Pradeep et al. "Electronic, Magnetic and Optical Materials: Second Edition", CRC Press (Taylor and Francis Group), Boca Roton, Florida (2017), 710 pages.

*Primary Examiner* — Vincent Wall
(74) *Attorney, Agent, or Firm* — Muncy, Geissler, Olds & Lowe, P.C.

(57) ABSTRACT

A vertical gallium oxide transistor and a preparation method thereof. The method includes: annealing a gallium oxide material in an oxygen atmosphere at a range of temperature of 1000 to 1400° C. for 1 to 24 h so as to form a single crystal layer, a defective layer and an oxidized layer; removing the defective layer and the oxidized layer on a back of the gallium oxide material and the defective layer on a front of the gallium oxide material so as to obtain an initial sample; and preparing a heavily doped implanted layer on the oxidized layer, preparing a source electrode layer on the implanted layer, and preparing a trench perpendicular to a plane of the sample, and preparing a gate dielectric layer in the trench to fabricate a gate electrode and a drain electrode.

9 Claims, 2 Drawing Sheets

(51) Int. Cl.

| | |
|---|---|
| ***H10D 62/80*** | (2025.01) |
| ***H10D 64/01*** | (2025.01) |
| ***H10P 30/20*** | (2026.01) |
| ***H10P 50/20*** | (2026.01) |
| ***H10P 52/00*** | (2026.01) |
| ***H10P 95/70*** | (2026.01) |
| ***H10P 95/90*** | (2026.01) |

(52) U.S. Cl.
CPC ........... *H10D 62/80* (2025.01); *H10D 64/011* (2026.01); *H10P 30/202* (2026.01); *H10P 50/20* (2026.01); *H10P 52/00* (2026.01); *H10P 95/70* (2026.01); *H10P 95/90* (2026.01)

(56) References Cited

U.S. PATENT DOCUMENTS

| | | | | |
|---|---|---|---|---|
| 2014/0217469 | A1* | 8/2014 | Sasaki .................... | H10D 62/60<br>257/192 |
| 2022/0209000 | A1 | 6/2022 | Huang et al. | |

FOREIGN PATENT DOCUMENTS

| | | | |
|---|---|---|---|
| CN | 113421914 | A | 9/2021 |
| CN | 113622027 | A | 11/2021 |
| CN | 114086254 | A | 2/2022 |

* cited by examiner

VERTICAL GALLIUM OXIDE TRANSISTOR AND PREPARATION METHOD THEREOF

CROSS REFERENCE TO RELATED APPLICATIONS

This application is a Continuation of U.S. National Stage of International Application No. PCT/CN2022/119566, filed on Sep. 19, 2022, for which priority is claimed under 35 U.S.C. § 120, which claims priority to 202211089166.6, filed in China on Sep. 7, 2022, the entire contents of all of which are hereby incorporated by reference

TECHNICAL FIELD

The disclosure relates to the technical field of semiconductors, in particular to a vertical gallium oxide transistor and a preparation method thereof.

BACKGROUND ART

Gallium oxide is a new ultra-wide band gap semiconductor material. Transistors based on a gallium oxide material have characteristics of potential breakdown resistance and low loss, and are expected to be applied in power electronics. Gallium oxide transistors can be classified into two types, namely a horizontal type and a vertical type, according to their structural types. As shown in FIG. 1(*a*), it is a horizontal transistor. In related art, the gallium oxide transistors are mainly of a horizontal structure (conventional horizontal accumulation-mode MOSFETs), and a gallium oxide field effect transistor with a horizontal structure cannot bear high current density due to its thin channel thickness, and is difficult to meet actual application requirements.

As shown in FIG. 1(*b*), it is a vertical transistor, and the vertical transistor can withstand a higher current, and thus exhibits more potential than horizontal devices. However, at present, it is difficult for the gallium oxide to be P-type doped, so it is impossible to design a conventional vertical MOSFET structure like traditional semiconductor Si or SiC, such as VDMOSFET and UMOSFET which are junction devices, that is, there is a PN junction between a source electrode and a drain electrode for electrical isolation and the junction device is operated in an inversion mode.

In related art, in order to realize a gallium oxide vertical MOSFET structure, structures such as a Current Aperture Vertical Electron Transistor (CAVET) or vertical Fin Field Effect Transistor (FinFET) are adopted. The CAVET structure is realized by N-ion and Si-ion implantation. An N-ion implantation region acts as a current blocking layer and a Si-ion implantation region acts as an electron channel layer. The FinFET structure involves fine Fin channels, each of which is about several hundred nanometers wide. Both the CAVET and FinFET structures are operated in an accumulation mode (junction-free), which is different from the conventional VDMOSFET and UMOSFET operated in the inversion mode (junction devices). A huge problem of a junction-free device is unstability of the device, which tends to be a depletion device (with a threshold voltage less than zero and being against an enhancement device). The threshold voltage of the device is prone to shift and uniformity of threshold voltages of multiple devices is poor, and thus it is difficult to achieve mass production by standard. If the junction device is operated in the inversion mode, it must be an enhancement device which is more acceptable in the industry and has better threshold-voltage stability. Therefore, it is necessary to develop a junction gallium oxide transistor operated in the inversion mode.

SUMMARY

In the disclosure, problems of a not large enough current, difficulty in realizing an enhancement mode, and easy shifting of a threshold voltage of a gallium oxide field effect transistor in related art are solved, and a gallium oxide field effect transistor with a vertical structure and operated in a quasi-inversion mode is designed.

A vertical gallium oxide transistor is provided in this disclosure, which is a quasi-P-doped vertical gallium oxide transistor. An expression "quasi-P-doped" indicates there are compensated electrons and no hole is generated. A specific preparation method of the vertical gallium oxide transistor is as follows.

A preparation method of a vertical gallium oxide transistor includes following steps:

1) annealing a gallium oxide material in an oxygen atmosphere at a range of temperature of 1000 to 1400° C. for 1 to 24 h so as to form a single crystal layer, a defective layer and an oxidized layer;
2) removing the defective layer and the oxidized layer on a back of the gallium oxide material and the defective layer on a front of the gallium oxide material so as to obtain an initial sample; and
3) preparing a heavily doped implanted layer on the oxidized layer, preparing a source electrode layer on the implanted layer, and preparing a trench perpendicular to a plane of the sample, and preparing a gate dielectric layer in the trench to fabricate a gate electrode and a drain electrode.

As a preferred embodiment, the annealing atmosphere in step 1) further involves an air pressure less than one standard atmospheric pressure, and the oxygen atmosphere is a pure oxygen atmosphere or a mixed atmosphere of oxygen, nitrogen and argon.

As a preferred embodiment, step 3) includes following preparation processes:

- 3-1, preparing the heavily doped implanted layer on the oxidized layer on the front of the sample, which is then activated by annealing;
- 3-2, preparing a metal electrode with ohmic contact using a patterning process to form ohmic contact of the source electrode, and performing rapid thermal annealing;
- 3-3, performing inductively coupled plasma etching to form the trench perpendicular to the plane of the sample, an etching depth being determined according to a depth of the oxidized layer subjected to high-temperature annealing in step 1);
- 3-4, growing a gate dielectric layer on surfaces of the trench and the sample;
- 3-5, fabricating an opening on the gate dielectric layer using a patterning process so as to expose an electrode region;
- 3-6, preparing the gate electrode using a patterning process; and
- 3-7, preparing a metal electrode capable of forming ohmic contact so as to form ohmic contact of the drain electrode, and performing rapid thermal annealing.

As a preferred embodiment, in step 3-1, the activating by annealing includes: annealing in a nitrogen or argon atmosphere at a temperature of 100 to 1100° C. for 1 hour.

As a preferred embodiment, the rapid thermal annealing includes: annealing in a nitrogen or argon atmosphere at a temperature of 400 to 550° C. for 1 minute.

As a preferred embodiment, in preparing the heavily doped implanted layer, a doping element is donor impurity, including Si, Sn or Ge.

As a preferred embodiment, preparing the gate electrode, the drain electrode and the source electrode is made by evaporating Ti/Au by electron beam evaporation, magnetron sputtering or thermal evaporation.

Another preparation method of a vertical gallium oxide transistor is further disclosed.

A preparation method of a vertical gallium oxide transistor includes following steps: 1) preparing a high-resistance layer by N-ion implantation on a gallium oxide material so as to form an initial sample with a single crystal layer and a high-resistance layer; and 2) preparing a heavily doped implanted layer on an oxidized layer, preparing a source electrode layer on the implanted layer, and preparing a trench perpendicular to a plane of a sample, and preparing a gate dielectric layer in the trench to fabricate a gate electrode and a drain electrode.

The N-ion implantation involves energy ranging from 100 to 680 keV, a dose ranging from $10^{12}$ to $10^{15}$ $cm^{-2}$, and annealing at a temperature of 900 to 1200° C. in a nitrogen or argon atmosphere for 10 to 120 min.

The disclosure has following beneficial effects.

Firstly, the gallium oxide transistor provide according to the disclosure has a vertical structure, with whole bulk material being conductive, so that a problem of insufficient current in the related art can be solved.

Secondly, in view of a shortcoming that the gallium oxide material cannot be P-type doped and cannot be inverted, an idea of forming an oxidized layer by annealing in an oxygen atmosphere or forming a similar layer by the N-ion implantation is adopted as an alternative scheme.

The quasi-P-type doping is different from P-type doping in that the quasi-P-type doping can only serve to compensate electrons, which can realize a gallium oxide field effect transistor with a quasi-inversion structure, so it can solve a problem that the enhancement mode is difficult to be realized and a threshold voltage is prone to shifting. The high-temperature annealing in the oxygen atmosphere affects carrier concentration. In the defective layer and oxidized layer, the concentration is reduced to near zero due to compensation doping effect caused by the high-temperature annealing in the oxygen atmosphere or the N ion implantation, so the defective layer and oxidized layer can act as a high-resistance layer, and can be used as a "quasi-reverse" layer with the formed high-resistance layer. Common preparation logic is broken.

Specifically, high-temperature annealing technology, namely, annealing in the oxygen atmosphere at a temperature of 1000 to 1400° C. for 1 to 24 hours, is adopted in this scheme, which can form a high-resistance layer (the quasi-inversion layer). At present, there is no published technical document showing that the annealing at a temperature above 600° C. can form the high-resistance layer on single crystal gallium oxide, and thus this scheme is original.

With regard to ion implantation technology, for example, existing Si ion implantation is usually configured to improve ohmic contact and other functions, while a purpose of the N-ion implantation in this disclosure is to compensate doping and form the high-resistance layer (the quasi-inversion layer). An idea of preparing the high-resistance layer (the quasi-inversion layer) is proposed in this disclosure, which is realized by ion implantation and is original.

Furthermore, in this scheme, there is no need to cover $SiO_2$ as a shielding layer, which has an advantage in preparation processes.

BRIEF DESCRIPTION OF THE DRAWINGS

In order to explain the embodiments of the present disclosure or the technical scheme in the prior art more clearly, the drawings required in the description of the embodiments or the prior art will be briefly introduced below; obviously, the drawings in the following description are only some embodiments of the present disclosure, and other drawings can be obtained according to these drawings by those of ordinary skill in the art without paying creative labor.

FIG. 1(*b*) shows a vertical gallium oxide transistor;

DETAILED DESCRIPTION

In the following, technical schemes in embodiments of the disclosure will be described clearly and completely in connection with the attached drawings; obviously, the described embodiments are intended to be only a part of the embodiment of the disclosure, but not all of them. On a basis of the embodiments in this disclosure, all other embodiments obtained by the skilled in the art without any creative effort are within the protection scope of this disclosure.

Terms such as "first" and "second" in the claims and specifications of this disclosure are used to distinguish similar objects, and are not necessarily used to describe a specific order or sequence. It should be understood that the terms used in this way can be interchanged in appropriate cases, which is only used to describe a way of distinguishing objects with same attributes in embodiments of this application. In addition, terms "including" and "having" and any variations thereof are intended to cover non-exclusive inclusion, so that a process, method, system, product or apparatus containing a series of units need not be limited to those units, but may include other units not explicitly listed or inherent to these processes, methods, products or apparatus.

Embodiment 1

Figure 1A:
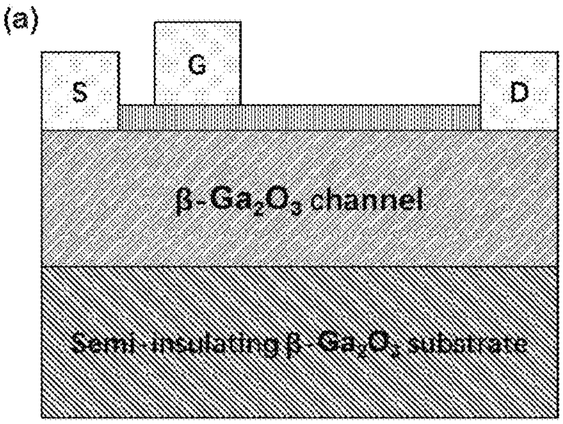
FIG. 1(a) (prior art)
FIG. 1(*a*) shows a horizontal gallium oxide transistor.
Figure 1B:
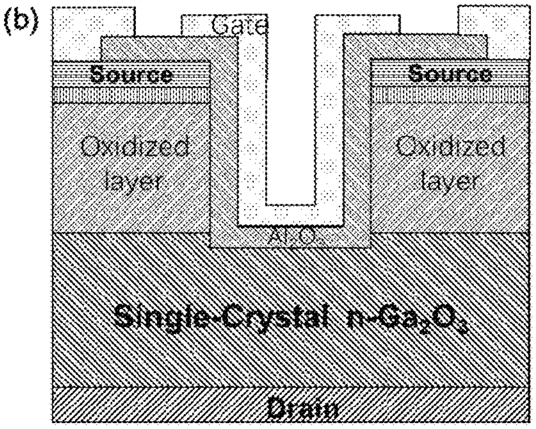
FIG. 1(b) (prior art)
Figure 2:
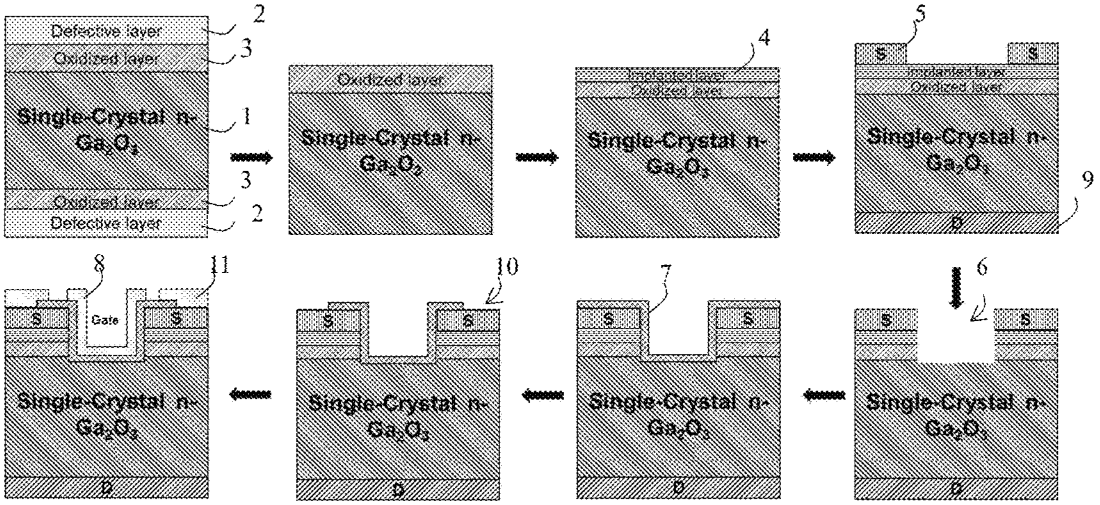
FIG. 2 is a flowchart of a preparation method of a vertical gallium oxide transistor.

A vertical gallium oxide transistor is disclosed in this embodiment, in which high-temperature annealing technology in an oxygen atmosphere is adopted to prepare a quasi-P-type doping for replacing p-type doping so as to realize device functions. As shown in FIG. 1(*b*) and FIG. 2, the vertical gallium oxide transistor is prepared as follows.

1) A gallium oxide material is annealed in an oxygen atmosphere at a range of temperature of 1000 to 1400° C. for 1 to 24 h so as to form a single crystal layer 1, a defective layer 2 and an oxidized layer 3.

2) The defective layer 2 and the oxidized layer 3 on a back of the gallium oxide material and the defective layer 2 on a front of the gallium oxide material are removed so as to obtain an initial sample.

3) A heavily doped implanted layer 4 is prepared on the oxidized layer, a source electrode layer 5 is prepared on the implanted layer, and a trench 6 perpendicular to a plane of the sample is prepared, and a gate dielectric layer 7 in the trench to fabricate a gate electrode 8 and a drain electrode 9 is prepared.

The annealing atmosphere further involves an air pressure equal to or greater than one standard atmospheric pressure, and the oxygen atmosphere is a pure oxygen atmosphere or a mixed atmosphere of oxygen, nitrogen or argon.

In step 2), $BCl_3$ and Ar or $Cl_2$ are used as etching gases to perform the inductively coupled plasma etching so as to etch away the defective layer and oxidized layer on the back and the defective layer on the front.

With regard to step 3) in which the heavily doped implanted layer is prepared on the oxidized layer, the source electrode layer is prepared on the implanted layer, and the trench perpendicular to the plane of the sample is prepared, and the gate dielectric layer is prepared in the trench to fabricate the gate electrode and the drain electrode. Detailed description is as follows.

3-1, the heavily doped implanted layer is prepared on the oxidized layer on the front of the sample, which is then activated by annealing.

The heavily doped implanted layer (implanted layer) is formed by epitaxial growth or ion implantation. Doping elements can be donor impurities such as Si, Sn, Ge, etc., and are activated by annealing at a temperature of 100 to 1100° C. in a nitrogen or argon atmosphere for 1 hour. This is made to improve quality of ohmic contact of a source. A preparation process of the implanted layer is not limited to these two types. If the technology can be realized, other schemes are not excluded, which is the same as preparation of other layers in the following.

3-2, a metal electrode with ohmic contact is prepared using a patterning process to form ohmic contact of the source electrode, and rapid thermal annealing is performed.

The patterning is made by photolithography and a Ti/Au or Cr/Au metal electrode can be evaporated by electron beam evaporation, magnetron sputtering or thermal evaporation, so as to form ohmic contact of the source electrode. A rapid thermal annealing mode is adopted to anneal in an atmosphere of nitrogen or argon gas for about 1 minute at a temperature of 400 to 550° C. so as to improve contact quality of the ohmic contact.

3-3, inductively coupled plasma etching is performed to form the trench perpendicular to the plane of the sample, an etching depth is determined according to a depth of the oxidized layer subjected to high-temperature annealing in step 1).

$BCl_3$ and Ar or $Cl_2$ are used as etching gases to perform the inductively coupled plasma etching so as to form the trench perpendicular to the plane of the sample. The etching depth needs to be determined according to effect of annealing at the oxygen atmosphere or ion implantation, which is generally in a range of 100 nanometers to 5 microns.

3-4, a gate dielectric layer is grown on surfaces of the trench and the sample.

Atomic layer deposition, magnetron sputtering or electron beam evaporation is adopted to grow high-quality gate dielectric layer, such as aluminum oxide, hafnium oxide, zirconium oxide, silicon oxide or stacked layers of above dielectrics. A total thickness of the dielectric is in a range of 10 nm to 200 nm.

3-5, an opening is fabricated on the gate dielectric layer using a patterning process so as to expose an electrode region.

The patterning is made by photolithography and an opening 10 is fabricated on the gate dielectric layer by etching to expose an electrode region. The etching can be dry etching or wet etching.

3-6, the gate electrode is prepared using a patterning process.

The patterning is made by photolithography and Ni/Au or other metal or polycrystalline is evaporated by electron beam evaporation, magnetron sputtering or thermal evaporation, so as to form the gate electrode.

3-7, a metal electrode 11 capable of forming ohmic contact is prepared so as to form ohmic contact of the drain electrode, and rapid thermal annealing is performed.

Ti/Au or other metal capable of forming ohmic contact are evaporated by electron beam evaporation, magnetron sputtering or thermal evaporation so as to form ohmic contact of the drain electrode, and rapid thermal annealing is adopted to anneal at a temperature of 400 to 550° C. for about 1 minute in a nitrogen or argon gas atmosphere so as to improve contact quality of the ohmic contact.

Step 3 to 7 can be switched to be any one of steps 3-1 to 3-6 without affecting a final result. An order of other steps is not interchangeable.

Embodiment 2

Based on a scheme in Embodiment 1 above, a more limited preparation method of a preferred vertical gallium oxide transistor and a vertical gallium oxide transistors prepared by this method are provided in this embodiment, which includes following steps 1) to 9).

In step 1) a gallium oxide material is annealed in a pure oxygen atmosphere at 1150° C. for 6 hours at a standard atmospheric pressure.

In step 2), $BCl_3$ and Ar or $Cl_2$ are used as etching gases to perform the inductively coupled plasma etching so as to etch away the defective layer and oxidized layer on the back and the defective layer on the front.

In step 3), the heavily doped implanted layer is formed by ion implantation. A doping element can be Si, and is activated by annealing at a temperature of 950° C. in an argon atmosphere for 1 hour, with allowable errors in temperature and time.

In step 4), patterning is made by photolithography and Ti/Au is evaporated by electron beam evaporation, so as to form ohmic contact of the source electrode. A rapid thermal annealing mode is adopted to anneal in a nitrogen atmosphere at 470° C. for 1 minute.

In step 5), $BCl_3$ and Ar are used as etching gases to perform the inductively coupled plasma etching so as to form a trench of 1 micron perpendicular to the plane of the sample.

In step 6), high-quality 50 nm alumina is grown in the trench using atomic layer deposition.

In step 7), patterning is made by photolithography and an opening is fabricated on the alumina gate dielectric layer by dry etching to expose a source electrode region below.

In step 8), patterning i$ made by photolithography and Ni/Au is evaporated by electron beam evaporation, so as to form the gate electrode.

In step 9), Ti/Au is evaporated by electron beam evaporation to form ohmic contact of the drain electrode, and rapid thermal annealing is adopted to anneal at 470° C. in a nitrogen atmosphere for about 1 minute to improve contact quality of the ohmic contact.

Step 9 can be switched to any one of steps 3 to 8 without affecting a final result. An order of other steps is not interchangeable.

Embodiment 3

Based on schemes of Embodiment 1 and Embodiment 2, another preparation method of a vertical gallium oxide transistor is provided, with difference that in step 1, a high-resistance layer is prepared by N-ion implantation on a gallium oxide material so as to form an initial sample with a single crystal layer and a high-resistance layer and the step 2) is removed, remaining steps remain unchanged, which can be referred to the above.

The N-ion implantation involves energy ranging from 100 to 680 keV, a dose ranging from $10^{12}$ to $10^{15}$ $cm^{-2}$, and annealing at a temperature of 900 to 1200° C. in a nitrogen or argon atmosphere for 10 to 120 min.

As a preferred embodiment, the N-ion implantation involves energy of 480 keV, a dose of $10^{14}$ $cm^{-3}$, and annealing at a temperature of 1100° C. in a nitrogen atmosphere for 1 hour.

Embodiment 4

Figure 3:
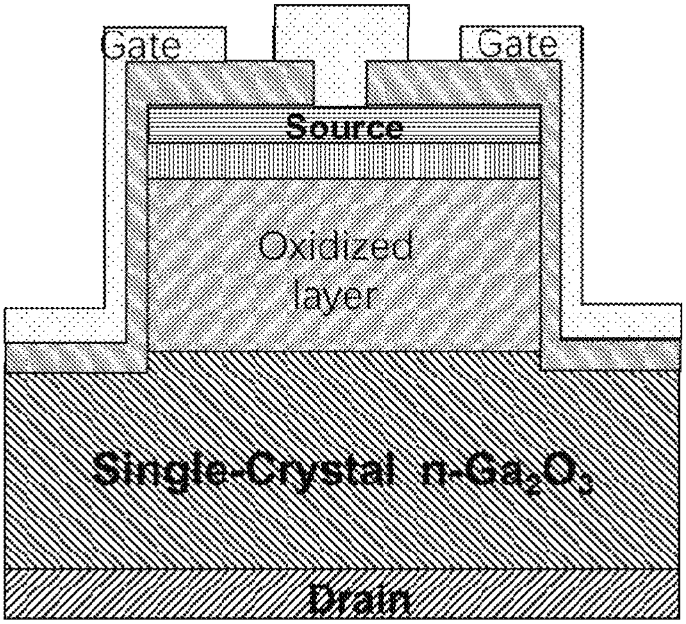
FIG. 3 shows a vertical gallium oxide transistor with a gate electrode outside.

Based on schemes of Embodiments 1 to 3, as a variation, a vertical gallium oxide transistor with a gate electrode outside is further prepared as shown in FIG. 3, and positions of the gate electrode and the source electrode are adjusted, preparation steps of the above embodiment are kept unchanged, positions of the gate electrode and the source electrode are exchanged, and trenches are prepared on both sides of the initial sample.

Figure 4:
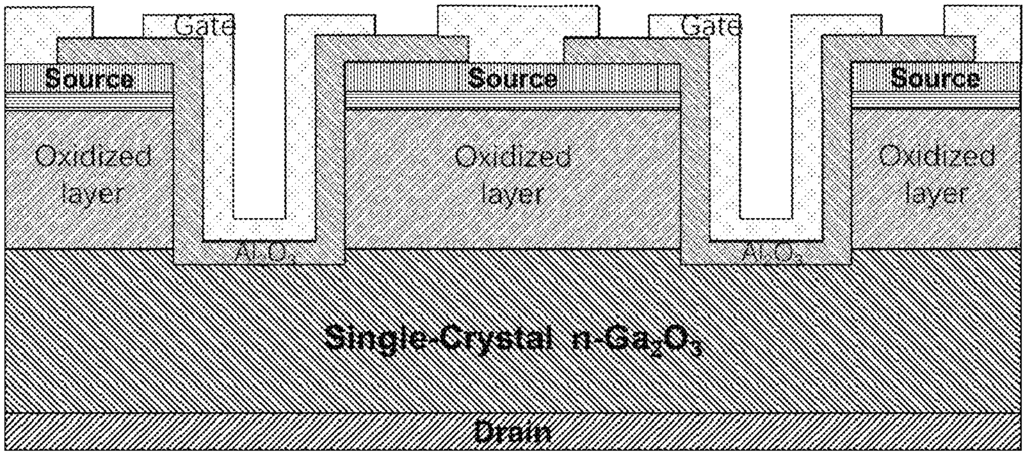
FIG. 4 shows bipolar parallel-connected vertical gallium oxide transistors.

As another variation, two or more devices are connected in multi-level parallel, and FIG. 4 shows a structure of two devices in parallel.

An operation principle of the device of the disclosure is as follows.

In the disclosure, the high-resistance layer is formed by annealing at the oxygen atmosphere or N-ion implantation, and the heavily doped layer is formed by Si, Sn or Ge ion implantation, so that a channel between the source electrode and the drain electrode in the transistor structure forms an "n-type conductive layer-high-resistance layer-n-type conductive layer" composition form, which causes the device to be normally in a state where current cannot be conducted. When a positive bias is applied as a gate voltage of the device, electrons are accumulated at the high-resistance layer, and the original channel forms a composition form of "n-type conductive layer-electron accumulation layer-n-type conductive layer", and the state of the device changes to a state where current can be conducted. Therefore, switching characteristics of the transistor are realized.

The above is only specific embodiments of the present disclosure, but the protection scope of the present disclosure is not limited to this, and any change or substitution within the technical scope disclosed by the present disclosure should be encompassed within the protection scope of the present disclosure. Therefore, the protection scope of the present disclosure shall be subject to the protection scope of the claims.

The invention claimed is:

1. A preparation method of a vertical gallium oxide transistor, comprising:

1) annealing a gallium oxide material in an oxygen atmosphere at a range of temperature of 1000 to 1400° C. for 1 to 24 h so as to form a single crystal layer, a defective layer and an oxidized layer;

2) removing the defective layer and the oxidized layer on a back of the gallium oxide material and the defective layer on a front of the gallium oxide material so as to obtain an initial sample; and 3) preparing an implanted layer on the oxidized layer, preparing a source electrode layer on the implanted layer, and preparing a trench perpendicular to a plane of the sample, and preparing a gate dielectric layer in the trench to fabricate a gate electrode and a drain electrode.

2. The preparation method of the vertical gallium oxide transistor according to claim 1, wherein the annealing atmosphere in step 1) further involves an air pressure less than one standard atmospheric pressure, and the oxygen atmosphere is a pure oxygen atmosphere or a mixed atmosphere of oxygen, nitrogen or argon.

3. The preparation method of the vertical gallium oxide transistor according to claim 1, wherein step 3) comprises:

3-1, preparing the implanted layer on the oxidized layer on the front of the sample, which is then activated by annealing;

3-2, preparing a metal electrode with ohmic contact using a patterning process to form ohmic contact of the source electrode, and performing rapid thermal annealing;

3-3, performing inductively coupled plasma etching to form the trench perpendicular to the plane of the sample, an etching depth being determined according to a depth of the oxidized layer subjected to high-temperature annealing in step 1);

3-4, growing the gate dielectric layer on surfaces of the trench and the sample;

3-5, fabricating an opening on the gate dielectric layer using a patterning process so as to expose an electrode region;

3-6, preparing the gate electrode using a patterning process; and 3-7, preparing a metal electrode capable of forming ohmic contact so as to form ohmic contact of the drain electrode, and performing rapid thermal annealing.

4. The preparation method of the vertical gallium oxide transistor according to claim 3, wherein in preparing the implanted layer, a doping element is donor impurity, including Si, Sn or Ge.

5. The preparation method of the vertical gallium oxide transistor according to claim 3, wherein preparing the gate electrode, the drain electrode and the source electrode is made by evaporating Ti/Au by electron beam evaporation, magnetron sputtering or thermal evaporation.

6. The preparation method of vertical gallium oxide transistor according to claim 3, wherein in step 3-1, the activating by annealing comprises: annealing in a nitrogen or argon atmosphere at a temperature of 100 to 1100° C. within 1 hour.

7. The preparation method of vertical gallium oxide transistor according to claim 3, wherein the rapid thermal annealing comprises: annealing in a nitrogen or argon atmosphere at a temperature of 400 to 550° C. for 1 minute.

8. The preparation method of the vertical gallium oxide transistor according to claim 1, wherein in preparing the implanted layer, a doping element is donor impurity, including Si, Sn or Ge.

9. The preparation method of the vertical gallium oxide transistor according to claim 1, wherein preparing the gate electrode, the drain electrode and the source electrode is made by evaporating Ti/Au by electron beam evaporation, magnetron sputtering or thermal evaporation.

* * * * *